United States Patent [19]

Minesi

[11] 4,253,518

[45] Mar. 3, 1981

[54] COOLING INSTALLATION WORKING THROUGH A CHANGE IN PHASE

[75] Inventor: Didier Minesi, Saint Fargeau-Ponthierry, France

[73] Assignee: Matra, Paris, France

[21] Appl. No.: 6,822

[22] Filed: Jan. 26, 1979

[51] Int. Cl.³ .............................................. F28D 15/00
[52] U.S. Cl. ........................... 165/105; 165/DIG. 24; 336/58; 361/385
[58] Field of Search ....... 165/105, DIG. 14, DIG. 24; 336/58; 361/385

[56] References Cited

U.S. PATENT DOCUMENTS

| | | | |
|---|---|---|---|
| 1,705,721 | 3/1929 | Dann .................................... | 336/58 X |
| 2,288,341 | 6/1942 | Addink ............................. | 165/105 X |
| 2,643,282 | 6/1953 | Greene ............................... | 165/105 X |
| 3,448,219 | 6/1969 | Nabazawa et al. ................ | 336/58 X |
| 3,968,787 | 7/1976 | Basiulis ................................. | 126/290 |

*Primary Examiner*—Albert W. Davis
*Attorney, Agent, or Firm*—Seidel, Gonda, Goldhammer & Panitch

[57] ABSTRACT

(a) A cooling installation working through a change in Phase.

(b) An installation wherein the chamber is connected to an expansion vessel through a valve calibrated at a determined opening pressure depending on the nature of the heat-carrier fluid and on the maximal temperature desired within the chamber and/or on the element to be cooled, said expansion vessel carrying a means for draining off the contents of the expansion vessel.

3 Claims, 2 Drawing Figures

COOLING INSTALLATION WORKING THROUGH A CHANGE IN PHASE

The invention relates to a cooling installation working through a change in phase and particularly to a cooling installation working through a change in phase which can be applied to electronic circuits.

It is already known to cool electronic circuits or components contained in a chamber by using the vaporization heat of a fluid wherein said components to be cooled are dipped. Such an installation is shown in FIG. 1. This installation consists of a chamber 1 surrounding, at least partly, the element 2 to be cooled. Said element 2 is dipped into a liquid 3. The chamber 1 includes a condenser 5 at its upper portion.

The liquid, which vaporizes when contacting the element 2 to be cooled, passes in a vapor state 4 which condenses on the surface of the condenser 5. The condensed liquid falls into the liquid 3.

The condenser 5 may be operates by a second cooling fluid such as water. Also, it may merely be a matter of a plate exchanging the heat with the ambient air through radiation and convection.

The main drawback shown by such an installation is the very great susceptibility thereof to the penetration of the ambient air into the chamber 1. As a matter of fact, when said chamber 1 is cleared of air, the heat-carrier is only separated from the condenser 5 by a phase of saturating vapor. The pressure P inside the chamber 1 is that of the saturating vapor at the temperature of said chamber. There is then an a lower pressure inside which tends to make the external air penetrate the chamber via with the joints, the welds, etc. Now, the air located in the chamber 1 lowers the thermic output of the installation. As practically it is not possible to achieve a totally hermetical circuit, some air unavoidably penetrates the circuit and the performances are progressively reduced. At a certain point, the thermic output reaches a sufficiently high level so as to necessitate a draining of the installation. Now, such a draining is a rather delicate operation to perform and runs the risk of a loss of vapor of the heat-carrier fluid.

The present invention is aimed at providing a cooling installation working through a change in phase which can easily be achieved, is efficient and makes it possible to simplify draining operations without involving notable losses of the heat-carrier fluid.

To this end, the invention relates to an installation of the above type, wherein the chamber is connected to an expansion vessel through a valve calibrated at a determined opening pressure depending on the nature of the heat-carrier fluid and on the maximal temperature desired inside the chamber and/or on the element to be cooled, said expansion vessel carrying a means for draining off the contents of the expansion vessel.

Said expansion vessel makes it possible to trap the air contained in the chamber. The development of the expansion of the vessel 6 gives an indication on the quantity of air contained in said expansion vessel. When a reasonable limit is reached, it is then necessary to empty said expansion vessel by letting the air it contains escape. If this operation is performed after a sufficient resting time of the device, most of the vapor of the heat-carrier fluid has then condensed. The loss of vapor of said heat-carrier fluid is then extremely small.

The draining operation is performed under extremely simple conditions since it suffices to open a tap for this purpose.

Furthermore, the installation works in such a way that can be automatically regulated. As a matter of fact, as soon as the quantity of air contained in the chamber exceeds a certain value and the temperature increases due to an increase of the thermic dissipation of the element 2 to be cooled, the rise of the pressure in the chamber automatically opens the valve. The air which then passes through the expansion vessel reduces the quantity of air of the cooling circuit whose caloric output increases. The quantity of heat drained off increases while the temperature becomes stable and the device operates at maximal conditions.

When the temperature decreases further to a diminution of the thermic dissipation of the element 2 to be cooled, the diminution of the pressure inside the chamber causes the closing of the valve.

The air thus confined can be drained off before the following opening of the valve or retained in the expansion vessel until the volume of air contained in said expansion vessel reaches a determined value necessitating a draining.

The present invention will be described with more details by means of the attached drawings, wherein.

Figure 2:
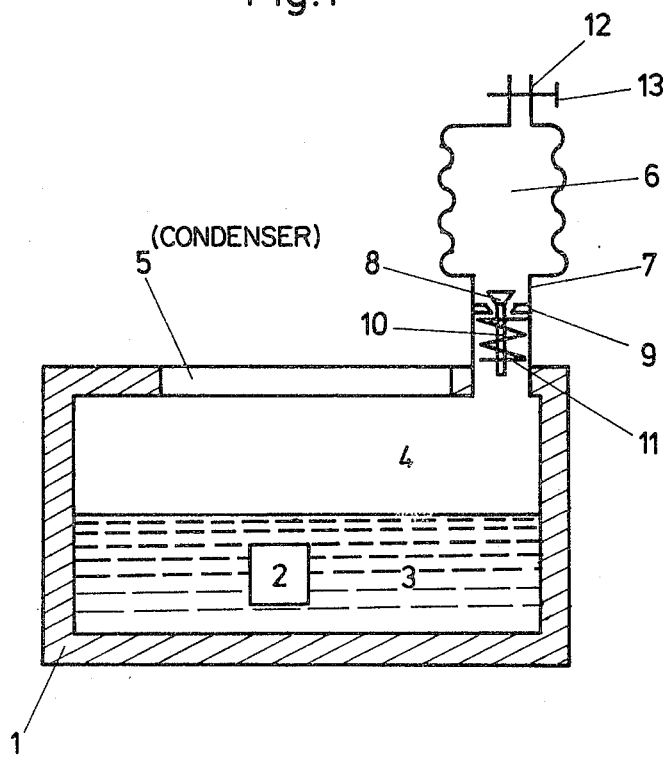
FIG. 2 is a diagrammatical view similar to FIG. 1, of a cooling installation working through a change in phase according to the invention.

As shown in FIG. 2, the cooling installation working through a change in phase according to the invention consists of a chamber 1 surrounding, at least partly, the element 2 to be cooled. The cooling liquid 3 contained in said chamber 1 vaporizes by receiving the heat of the element 2 to be cooled and the vapor 4 thus formed cools and condenses by transmitting the heat to the condenser. The condensed liquid falls down into the liquid 3.

An expansion vessel 6 is connected to the chamber by a pipe 7 which carries a valve 8 co-operating with a valve-seat 9. The rod 10 of the valve 8 is biased by the action of a drawback spring 11 keeping the valve 8 flush against its seat 9 as long as the pressure inside the chamber 1 has a predetermined value lower than that inside the expansion vessel 6. Said expansion vessel 6 also carries a vent valve diagrammatically shown by a tube 12 and a valve 13.

The installation described hereabove works as follows:

The element 2 to be cooled dissipates a thermic energy $Qc$. Between said element 2 and the boiling heat-carrier 3, the thermic resistance is $\rho\,ce$.

In the absence of air within the chamber, the temperature of the element 2 is $Tc$, the temperature of the fluid is $Te$. The quantity of heat exchanged between the element 2 and the fluid 3 is given by the relation (1) $Tc - Te = \rho ce\, Qc$. The condenser 5 is at a fixed temperature $Tf$. The vapor 4 of the heat-carrier fluid in contact with the condenser is at a temperature $Tv$. Between the vapor 4 and the condenser 5, the thermic resistance is $\rho vf$. The principle of the device is to supply the condenser 5 with the totality of the energy $Qc$ dissipated by the element 2. There is then the relation $Tv - Tf = \rho vf\, Qc$ (2). The pressure at any part of the chamber is the pressure of the saturating vapor of the heat-carrier fluid.

The pressure of the saturating vapor only depends on the temperature thereof. As a first approximation, the pressure inside the chamber is uniform, the temperature also is uniform. It results therefrom that the temperature of the vapor Tv is equal to the temperature of the liquid Te, $Tv=Te$ (3). The relation (2) $Tv-Tf=\rho vf\,Qc$ is then equivalent to the relation (4) $Te-Tf=\rho vf\,Qc$. The relation (1) $Tc-Te=\rho ce\,Qc$ makes it possible to determine the temperature Te of the element 2, the temperature Tf of the condenser being known from the relation (5) obtained by substituting the quantity Te given by the relation (4) in the relation (1) $Tc=Tf+(\rho vf+\rho ce)\,Qc$ (5).

When there is air in the chamber, the temperature of the element 2 is Tcl, the temperature of the fluid 3 is Tel.

The vapor is generated at the temperature Tel. It is admitted that there is no air on the surface of the liquid 3 because said air is driven off by the vaporization. Consequently, the pressure on the surface of the liquid 3 is the pressure Pv (Tel) of the saturating vapor at the temperature Tel at which it is generated.

The pressure inside the chamber is approximately uniform. Accordingly, the total pressure on the surface of the condenser 5 has the same value Pv (Tel).

On the surface of the condenser 5, the temperature of the vapor is Tvl. The partial pressure of the vapor is the pressure of the saturating vapor Pv (Tvl) at the temperature Tvl.

The total pressure Pv (Tel) is the sum of the partial pressure of the vapor Pv (Tvl) plus the partial pressure of the air Pa. Consequently, there is the relation $Pv\,(Tel)=Pv\,(Tvl)+Pa$ (6).

The pressure of the saturating vapor depending only on the temperature thereof, the relation (6) is equivalent to $Tel=Tvl+KPa$ (7). In this relation, KPa is much greater than the partial pressure of the air. Then, the temperature Tel of the liquid is greater than the temperature Tvl of the vapor by a quantity which increases as the quantity of the air contained in the chamber increases.

The temperature Tvl of the vapor and the temperature Tf of the condenser are linked together by the relation $Tvl-Tf=\rho vf\,Qc$ (8).

The temperature Tel of the liquid and the temperature Tvl of the vapor are linked together by the relation $Tel=Tvl+KPa$ (7).

Between the temperature Tcl of the element to be cooled and the temperature Tel of the liquid, there is the relation $Tcl-Tel=\rho ce\,Qc$ (10).

Consequently, between the temperature Tcl of the element to be cooled and the temperature Tf of the condenser, there is the relation $Tcl=Tf+(\rho vf+\rho ce)\,Qc+KPa$ (11).

This relation shows that the temperature Tcl of the element 2 is higher as the quantity of the air contained in the chamber is greater.

The principle of the cooling device is to limit the temperature of the element 2 to a predetermined value TcM by exchanging the heat it generates with the condenser 5 whose temperature is Tf. The element 2 reaches the maximal temperature TcM when the quantity of the air contained in the chamber reaches the maximal value. There is then the relation $TcM=(\rho vf+\rho ce)\,Qc+Tf+KPAM$ (12), KPAM being the value taken by the number KPa when the maximal quantity of air which can be tolerated in the chamber is reached.

The element 2 reaches the maximal temperature TcM when the liquid 3 reaches a temperature TeM determined by the thermic resistance $\rho ce$ and the dissipated thermic energy Qc for which there is the relation $TcM-TeM=\rho ce\,Qc$ (13).

It has been said above that the pressure inside the chamber only depends on the temperature of the boiling liquid. In particular, when the temperature of the liquid 3 reaches TeM, the pressure inside the chamber reaches a value $PM=Pv\,(TeM)$.

Po designating the atmospheric pressure inside the expansion vessel, the valve, is calibrated so as to open under a differential pressure PM−Po.

When the pressure in the chamber reaches PM, the valve the other surface of which is subjected to the atmospheric pressure Po, opens. Then, the air mixed with the vapor of the heat-carrier fluid escapes into the expansion vessel. Thereby, the quantity of air contained in the chamber decreases.

The pressure inside the vessel is Po, the pressure inside the chamber is PM, the difference between both pressures being the cause of the escape of the mixture of air with the vapor which is produced from the chamber 1 towards the expansion vessel 6.

The pressure inside the chamber cannot exceed PM, then the temperature of the liquid 3 cannot exceed TeM. As a result, the temperature of the component cannot exceed TcM.

Figure 1:
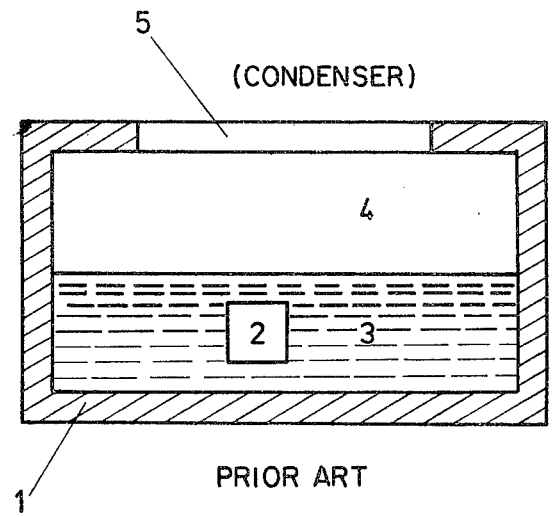
FIG. 1 is a diagrammatical view of a cooling installation working through a change in phase, according to the Prior Art.

If, when the installation is set in motion the chamber 1 contains too great a quantity of air to allow proper operation according to the known device shown in FIG. 1, the device according to the invention represented in FIG. 2 works as follows.

Under the effect of the thermic dissipation of the element 2 to be cooled, the temperature of said element 2 and the temperature of the liquid 3 simultaneously increase. When the temperature of the element 2 reaches the value TcM, the temperature of the liquid 3 reaches the value TeM and the pressure inside the chamber reaches the value PM. The valve 8 opens and a mixture made of air and saturated vapor escapes into the expansion vessel. Thus, the quantity of air contained in the chamber decreases and progressively reaches a value which results in the desired thermic output of the installation. This occurs because the temperature of the liquid 3 and the pressure inside the chamber no longer tend to increase. Thus, the valve 8 shuts again while the temperatures and the pressure keep their values.

When at a certain time the caloric energy dissipated by the element 2 decreases, the pressure inside the chamber 1 also decreases and the valve 8 is applied against its seat 9 by the spring 11.

The mixture of gas and vapor contained in the expansion vessel 6 progressively cools and the vapor of the heat-carrier fluid contained in the expansion vessel 6 condenses and collects around the seat 9 and the valve 8. For a certain cooling temperature, practically all the vapor of the heat-carrier fluid is again condensed to the liquid state and the expansion vessel 6 contains air only. If, subsequent to that, the element 2 would again dissipate a high caloric energy and, as a result of the dissipates, the quantity of air contained in the chamber would again be greater, the operation described hereabove could be repeated. The further quantity of a mixture of air and vapor of the heat-carrier fluid penetrates into the expansion vessel 6. When the valve 8 opens, the previously condensed vapor of the heat-carrier fluid returns into the chamber 1.

Then, the valve 8 shuts again, the vapor of the heat-carrier fluid condenses and the only gas which remains in the expansion vessel 6 is the air of the atmospheric pressure.

When a certain quantity of air is contained in the expansion vessel 6, the draining of said vessel is performed. Said draining is made when the device is fully cooled, so that the vapor of the heat-carrier fluid is completely recondensed.

Furthermore, the expansion vessel 6 has the advantage of indicating the volume of air contained in the vessel and thus of the necessity of performing a draining which is limited to the draining of said expansion vessel 6.

The invention applies to the cooling of many elements of various kinds and in particular of electronic components.

What I claim is:

1. In a cooling installation operating through a liquid-vapor change in phase comprising a chamber (1) containing an element (2) to be cooled and a liquid (3) which is vaporizable by taking heat from element (2) and a vapor space (4) above liquid (3), a condensor (5) associated with chamber (1) for condensing vaporized liquid to its liquid state, the improvement comprising expansion means (6) connected to chamber (1) by valve means (8, 9) above the level of liquid (3), valve means (8, 9) being calibrated to open at a predetermined pressure which depends on the nature of liquid (3) and the desired temperature in chamber (1) or element (2), expansion means (6) being normally closed to the atmosphere surrounding chamber (1) and being expansible by vapor and air received from chamber (1) when valve means (8, 9) is opened, and vent means (12, 13) connected to expansion means (6) above the level of any condensed liquid for releasing air but not liquid from expansion means (6).

2. Cooling installation according to claim 1 wherein valve means (8, 9) is biased to its closed position by calibrated spring means (11).

3. Cooling installation according to claim 1 wherein vent means (12, 13) comprises a tube (12) provided with a valve (13).

* * * * *